(12) United States Patent
Daum et al.

(10) Patent No.: US 6,274,965 B1
(45) Date of Patent: *Aug. 14, 2001

(54) PIEZOELECTRIC MOTOR FOR USE IN MAGNETIC FIELDS

(76) Inventors: Wolfgang Daum, Schelfmarkt 10, Schwerin (DE), 19055; Thomas Günther, Hermannstrasse 16, Schwerin (DE), 19053; Axel Winkel, Speicherweg 13, Zapel Hof (DE), 19089

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/033,763

(22) Filed: Mar. 3, 1998

(30) Foreign Application Priority Data

Mar. 6, 1997 (DE) .............................................. 197 09 267

(51) Int. Cl.[7] .................................................... H02N 2/00

(52) U.S. Cl. ......................................................... 310/323.11
(58) Field of Search .............................. 310/323, 323.03, 310/323.04, 323.08, 323.11

(56) References Cited

U.S. PATENT DOCUMENTS 4,933,981 * 6/1990 Lederer .................................... 381/90
5,233,257 * 8/1993 Luthier et al. ......................... 310/323

* cited by examiner

Primary Examiner—Nestor Ramirez
Assistant Examiner—Peter Medley

(57) ABSTRACT

A motor for use in magnetic fields generated for medical imaging. The motor comprises a stator. The stator includes a piezoelectric material and is configured to generate vibrations when subjected to a voltage gradient. A rotor is arranged and configured so that vibrations generated in the stator will propel the rotor. A drive shaft is connected to the rotor. The rotor and drive shaft are formed from a material that has a magnetic susceptibility that is about the same as the magnetic susceptibility of water.

8 Claims, 1 Drawing Sheet

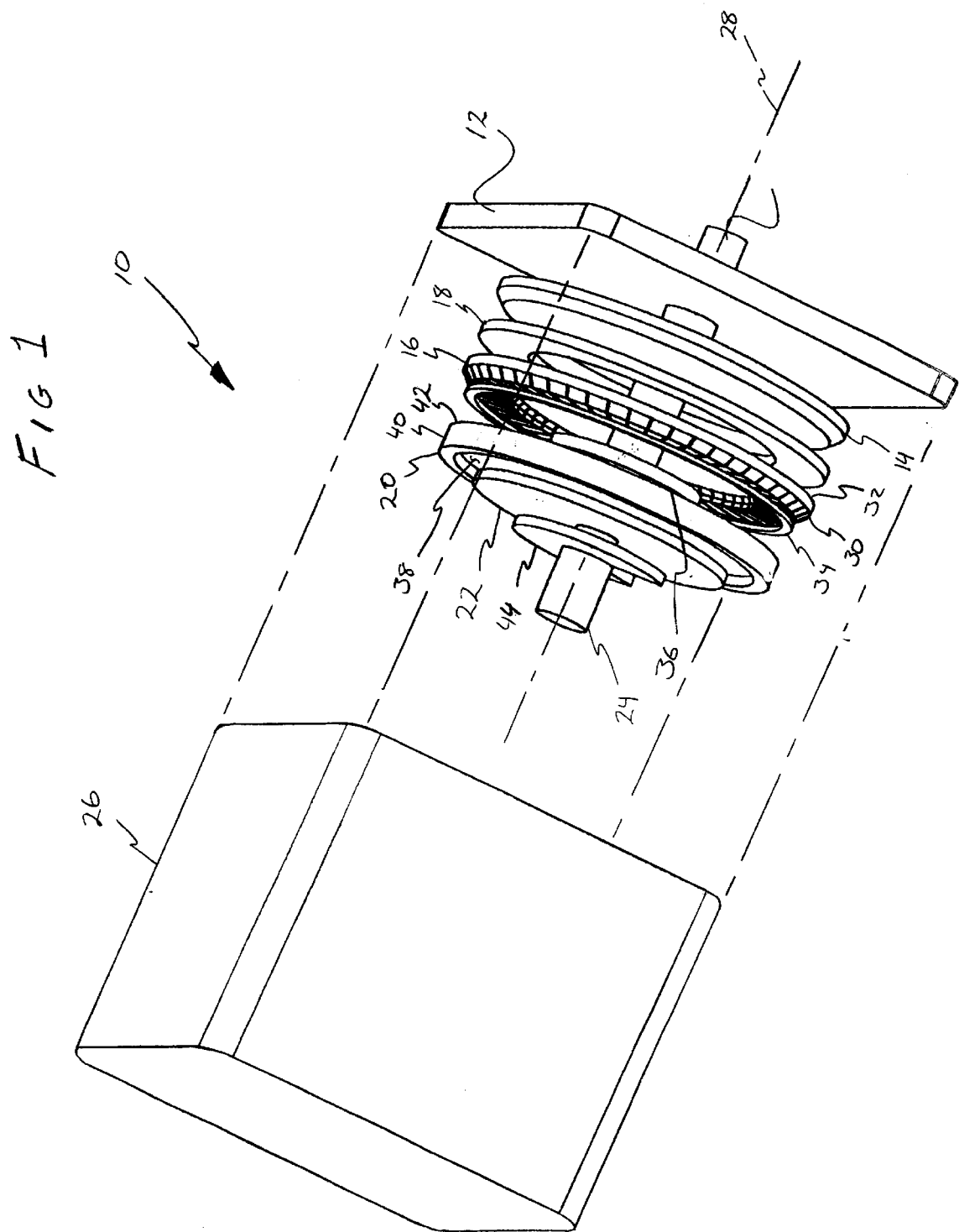

PIEZOELECTRIC MOTOR FOR USE IN MAGNETIC FIELDS

REFERENCE TO PRIORITY DOCUMENTS

The present application claims priority to German patent application 197 09 267.5, which was filed on Mar. 6, 1997 and entitled Motor für die Anwendung Magnetfeld, the disclosure of which is hereby incorporated by reference.

TECHNICAL FIELD

The present invention relates to motors, and more particularly to motors for use in applications, such as medical imaging, that place the motor in strong magnetic fields.

BACKGROUND

Magnetic resonant imaging (MRI) is used to generate images of the inside of a patient's body. MRI uses magnets and coils to generate a strong and uniform magnetic field that causes the electrons in a patient's body to spin in a uniform and predictable manner. The MRI equipment can then manipulate the spinning electrons and use the resulting information to generate an image of the inside of a patient's body.

The difficulty is that disruptions and deflections in the magnetic field will effect the spinning reaction of the electrons. As a result, the generated image may show artifacts that distort the image of the patients body. One source of distortion is equipment such as motors that are in the vicinity of the MRI machine. Motors are generally formed with material that produces a magnetic field and/or is susceptible to producing its own magnetic field when placed within an external magnetic field. Examples of such materials that are commonly used in motors include iron and brass. Thus, when placed in the field generated by the MRI machine, the motors can cause artifacts in the image of the patient's body.

Therefore, there is a need for a motor that can be placed near an MRI machine that has minimal risk of creating artifacts that the MRI generates. There is a related need for a motor that does not produce a magnetic field. There is yet another need for a motor that has a low susceptibility of being induced to produce a magnetic field.

SUMMARY

The present invention is directed to a motor for use in magnetic fields that are generated for medical imaging. The motor comprises a stator. The stator includes a piezoelectric material and is configured to generate vibrations when subjected to a voltage gradient. A rotor is arranged and configured so that vibrations generated in the stator will propel the rotor. A drive shaft is connected to the rotor. The rotor and drive shaft are formed from a material that generates low levels of artifacts in the medical image.

Another embodiment of the present invention is directed to a method of using a motor. The method comprised the steps of: generating a magnetic field for magnetic resonance imaging, the magnetic field having a strength of about 0.05 Tesla or greater; providing a motor being formed of materials that produce low levels of magnetic artifacts; and placing the motor in the magnetic field wherein the magnetic field remains substantially undeflected by the motor.

DETAILED DESCRIPTION OF THE DRAWINGS

FIG. 1 is a perspective, exploded view of a motor that embodies the present invention.

DETAILED DESCRIPTION

Various embodiments of the present invention will be described in detail with reference to the drawings, wherein like reference numerals represent like parts and assemblies throughout the several views. Reference to the various embodiments does not limit the scope of the invention, which is limited only by the scope of the claims attached hereto.

In general, the present invention relates to motors that are made with materials that have low magnetic susceptibility and produces minimal, if any, magnetic fields. Such a motor has significant advantage when used near machines and processes that produce a magnetic field and rely on that magnetic filed. Machines used in magnetic resonance tomography is an example of an application in which the present invention has significant advantages. These machines generate both a main field, which is generally homogenous and is used in generating a medical image, and stray fields.

One advantage is that a motor embodying the present invention will produce minimal deflection or distortion of the magnetic field and thus can be used in both the main and stray portions of the magnetic fields that have a strength of about 0.05 Tesla or more. A motor embodying the present invention will create minimal, if any, artifacts or distortions in the medical images generated by such machines, which typically uses a magnetic field having a strength in the range of about 0.1 Tesla to about 0.7 Tesla.

Given these advantages, a motor embodying the present invention can be used for a variety of applications under magnetic resonance imaging, including driving a medical-injector device for MR-contrast substance such as a gadolinium-based substance for angiography, and driving drilling machinery for driving bone-biopsy needles into human bone.

Referring now to FIG. 1, a motor, generally shown as 10, includes a sole plate 12, a substructure 14, a first stator element 16, a second stator element 18, a rotor 20, a spring holding element 22, a drive shaft 24, and a housing 26. The sole plate 12 is positioned along an axis 28 and is substantially perpendicular to the axis 28. The substructure 14 is circular and connected to the sole plate 12 in that the substructure 14 and sole plate 12 are either directly joined or are connected to each other by way of a common connection to another structure. The substructure 14 and sole plate 12 are in a position fixed relative to one another.

The first stator element 16 is formed from an elastic material. The first stator element 16 is configured in a ring and is substantially perpendicular to the axis. The first stator element 16 has first and second sides 30 and 32. The first side 30 defines an annular rim 34 that has a diameter and projects outward, toward the rotor 20. In one possible embodiment, the first stator element 16 has a magnetic susceptibility about that of water. Additionally, the first stator element 16 does not produce a magnetic flux.

The second stator element 18 is formed from a material that has piezoelectric properties and a relatively low magnetic susceptibility. In one possible embodiment, the second stator element 18 is formed from piezoelectric ceramic. A voltage gradient applied to the second stator element 18 will cause deformations in the stator element 18 that produce vibrations or ultrasonic waves. The second stator element 18 is configured in a ring and is mounted to the first side 32 of the first stator element 16. In this configurations vibrations and ultrasonic waves generated by the second stator element 18 will be transmitted to the first stator element 16.

The drive shaft 24 extends along the axis 28 and passes through the center point of the first stator element 16, the center point of the second stator element 18, and the sole plate 12. A first collar 36 extends from the drive shaft 24 in the radial direction and is substantially perpendicular thereto. The first collar 36 is in a position fixed relative to the drive shaft 24 so that rotating the first collar 36 will cause the drive shaft 24 to rotate.

The rotor 20 is circular and is substantially perpendicular to the axis 28. The rotor 20 has a web 38 and a flange 40 formed at the circumference of the web 38. The web 38 engages the first collar 36 of the drive shaft 24. In one possible embodiment, the web 38 directly engages the collar 36. The flange 40 of the rotor 20 is substantially concentric to the rim 34 of the first stator element 16 and has substantially the same diameter as the rim 34 of the first stator element 16. In one possible embodiment, the flange 40 of the rotor 20 is positioned in close proximity to the rim 34 of the first stator element 16. In an alternative possible embodiment, one side 42 of the flange 40 is positioned against the rim 34 of the first stator element 16. In operation, the vibrations or ultrasonic waves produced by the second stator element 18 cause the rim 34 of the first stator element 16 to vibrate. These vibrations cause the rim 34 of the first stator element 16 to engage and propel the flange 40 of the rotor 20.

The spring-holding element 22 engages the web 38 of the rotor 20 and positioned on an opposite side of the web 38 from the first collar 36. In turn, a second collar 44 is secured to the rotor 20 and positioned so that the spring-holding element 22 is positioned between the second collar 42 and the rotor 20. In this configuration, the spring-holding element 22 urges the web 38 of the rotor 20 against the first collar 36, and holds the rotor 20 in a substantially fixed position relative to the first collar 36 and the drive shaft 24.

In one possible embodiment, the rotor 20, first and second collars 36 and 42, drive shaft 24, substructure 14, spring-holding element 22, sole plate 12, housing 26, and other materials that form part of the motor 10, but are not shown in FIG. 1, are formed from a material that does not produce magnetic flux.

Additionally, the rotor 20, first and second collars 26 and 42, drive shaft 24, substructure 14, spring-holding element 22, sole plate 12, housing 26, and other materials that form part of the motor 10, but are not shown in FIG. 1, are formed from a material that material has a low magnetic susceptibility. In one possible embodiment, for example, the magnetic susceptibility is about that of water. Examples of materials that have a low magnetic susceptibility and do not produce, or at least produce only low levels of magnetic flux include titanium, tantalum, aluminum, ceramics, wood, and biological substances. Materials such as titanium, tantalum, aluminum, and can be in the form of substantially pure metals or alloys.

The various embodiments described above are provided by way of illustration only and should not be construed to limit the invention. Those skilled in the art will readily recognize various modifications and changes that may be made to the present invention without following the example embodiments and applications illustrated and described herein, and without departing from the true spirit and scope of the present invention, which is set forth in the following claims.

The claimed invention is:

1. A piezo-electric motor, comprising:

a stator including a piezoelectric material and configured to generate vibrations when subjected to a voltage gradient;

a rotor arranged and configured so that the vibrations generated in the stator propel the rotor;

a drive shaft connected to the rotor;

a sole plate, the drive shaft extending through the sole plate;

a substructure connected to the sole plate;

a spring-holding element engaging the rotor; and a housing connected to the sole plate and enclosing the stator, rotor, and spring-holding element;

wherein the stator, rotor, drive shaft, sole plate, substructure, and spring-holding element are each formed from a material that generates low levels of magnetic artifacts.

2. The motor of claim 1, wherein the stator, rotor, drive shaft, sole plate, substructure, and spring-holding element are each formed from a material having a magnetic susceptibility approximately equal to a magnetic susceptibility of water.

3. The motor of claim 1 wherein the stator has:

a first stator element formed from an elastic material, the first stator element configured to engage the rotor;

and a second stator element, the second stator element mounted to the first stator element and formed from a piezoelectric element.

4. The motor of claim 3 wherein the rotor, sole plate, drive shaft, housing, substructure, and spring-holding element are formed from metals selected from the group consisting of: titanium, tantalum, and aluminum.

5. The motor of claim 3 wherein the rotor, sole plate, drive shaft, housing, substructure, and spring-holding element are formed from alloys that include metals selected from the group consisting of: titanium, tantalum, and aluminum.

6. The motor of claim 3 wherein the piezoelectric element forming the second stator element is formed from ceramic.

7. A method of using a motor, comprising the steps of:

generating a magnetic field for magnetic resonance imaging, the magnetic field having a magnetic field strength of at least about 0.05 Tesla;

providing a motor, having a stator including a piezoelectric material and being configured to generate vibrations when subjected to a voltage gradient, a rotor arranged and configured so that the vibrations generated in the stator propel the rotor, a drive shaft connected to the rotor, a sole plate, the drive shaft extending through the sole plate, a substructure connected to the sole plate, a spring-holding element engaging the rotor; and a housing connected to the sole plate and enclosing the stator, rotor, and spring-holding element, the stator, rotor, drive shaft, sole plate, substructure, and spring-holding element each being formed from a material that generates low levels of magnetic artifacts; and placing the motor in the magnetic field;

wherein the magnetic field remains substantially undeflected by the motor when the motor operates.

8. The method of claim 7 wherein the step of providing the motor includes the step of providing a motor formed from materials having a magnetic susceptibility approximately equal to the magnetic susceptibility of water.

* * * * *